United States Patent [19]

Faulkner

[11] 4,010,424
[45] Mar. 1, 1977

[54] PHASE-SENSITIVE DETECTOR CIRCUIT WITH COMPENSATION FOR OFFSET ERROR

[75] Inventor: Eric Andrew Faulkner, Cookham Dean, England

[73] Assignee: Brookdeal Electronics Limited, Bracknell, England

[22] Filed: Apr. 8, 1975

[21] Appl. No.: 566,680

[30] Foreign Application Priority Data

Apr. 8, 1974 United Kingdom ............. 15468/74

[52] U.S. Cl. .................................. 330/9; 307/230; 307/232; 307/235 K; 307/237; 307/297
[51] Int. Cl.² .......................................... H03F 1/02
[58] Field of Search ......... 330/9; 307/235 J, 235 K, 307/230, 297, 237, 232; 329/133

[56] References Cited

UNITED STATES PATENTS

| | | | |
|---|---|---|---|
| 3,237,116 | 2/1966 | Skinner et al. | 330/9 |
| 3,473,131 | 10/1969 | Perkins | 307/235 K |
| 3,757,241 | 9/1973 | Kime et al. | 330/9 X |
| 3,828,204 | 8/1974 | Farnsworth | 307/235 K |

Primary Examiner—John S. Heyman
Attorney, Agent, or Firm—Shoemaker and Mattare, Ltd.

[57] ABSTRACT

A phase-sensitive detector circuit comprises a pair of field-effect transistors switched in antiphase and connected at a switching point. The switching point is supplied with a signal to be detected through an a.c. coupling. One of the transistors is connected to the input of an operational amplifier having a feedback path designed to maintain its input as a virtual earth. A compensation circuit connected from the switching point to the input side of the a.c. coupling provides a compensation signal to cancel the effect of any offset voltage in the operational amplifier. The other switching transistor may be grounded or else may be connected to a second operational amplifier whose input is also maintained as a virtual earth by a feedback path. In the latter case the output from the circuit is taken differentially from the operational amplifier.

Alternatively, or in addition, a second pair of switching transistors supplied by a signal in antiphase to the signal supplied to the first-mentioned pair of transistors can be connected in a similar manner to supply the one or both operational amplifiers.

12 Claims, 7 Drawing Figures

PHASE-SENSITIVE DETECTOR CIRCUIT WITH COMPENSATION FOR OFFSET ERROR

BACKGROUND OF THE INVENTION

This invention relates to rectifier circuits and has particular reference to phase-sensitive detector circuits. Such circuits are used inter alia in recovering signals in the presence of unwanted noise.

In a phase-sensitive detector circuit two inputs are applied, namely the signal input and the reference input, and the circuit delivers an ouput which is in effect the product of the signal and reference inputs. One kind of phase-sensitive detector circuit comprises a pair of switching devices joined at a switching point to which the signal input is applied and the switching devices are switched by the reference signal in the manner of a two-way switch.

In modern electronic circuits a circuit element that is of wide application is an operational amplifier. Operational amplifiers are high gain d.c. coupled amplifiers and they usually have both an inverting input terminal and a non-inverting input terminal. By applying feedback from the output terminal of the operational amplifier to the inverting input terminal and grounding the non-inverting input it is possible to hold the inverting input terminal virtually at ground potential so that it may be termed a vertual earth.

It is suggested that a phase-sensitive detector circuit of the kind described above incorporates an operational amplifier in its output path and one of the switching devices be connected to the inverting input of the operational amplifier which is a virtual earth. The other switching device is connected to an actual earth or else to the inverting input of a further operational amplifier which is a virtual earth, in which case a balanced output is obtained.

It is an important feature of phase-sensitive detector circuits that their outputs are directly proportional to their inputs and this requires both that the output operational amplifier be linear and that no offset signal be generated within the operational amplifier. Such an offset signal may be shown by the presence of a non-zero output for a zero input. In a practical operational amplifier although good linearity is obtainable due to the use of feedback it is difficult to prevent an offset voltage occurring and it is an object of the invention to provide a phase-sensitive detector circuit in which such offsets are compensated for.

SUMMARY OF THE INVENTION

According to the invention a phase-sensitive detector circuit is characterised in that it comprises in combination a pair of switching devices joined at a switching point and arranged for control by reference switching signals in antiphase, an a.c. coupling between a signal input terminal and the said switching point, an output operational amplifier, including a feedback path from the output thereof to an input thereof whereby to hold said input virtually at ground potential in the absence of any offset voltage in said operational amplifier, a connection from one of the switching devices to an input of the output operational amplifier, a connection from the other of the switching devices to a terminal which is at ground potential, and a compensation circuit the input to which is supplied from the said switching point and the output from which is applied to the said a.c. coupling for the purpose of providing a compensating signal to tend to eliminate the effect of any offset voltage occurring in the output operational amplifier.

Preferably, the compensating circuit includes an operational amplifier connected as a voltage follower.

In carrying out the invention an input operational amplifier may be interposed between the signal input terminal and the a.c. coupling and in order to ensure the proper phase relationships the signal input terminal is connected to the inverting input of the input operational amplifier, the operational amplifier included in the compensation circuit has its non-inverting input connected to the switching point and its output is connected to the non-inverting input of the input operational amplifier.

The circuit described above is inherently unbalanced and provides half-wave rectification. The circuit may be readily modified for full-wave rectification by providing a balanced output by means of a further output operational amplifier having its input at virtual earth and connecting the other switching device to such input in place of its connection to an earth terminal. The output is taken differentially from the two output operational amplifiers.

It is also possible to obtain balanced full-wave rectification by providing a further pair of switching devices and a further a.c. coupling. The signal input to the further a.c. coupling is required to be in antiphase with the signal input at the first-mentioned a.c. coupling and an appropriate one of the further switching devices is connected to the output operational amplifier, or where a balanced output is required, both of the further switching devices are appropriately connected to the two output operational amplifiers. A further compensation circuit similar to the first-mentioned compensation circuit can also be provided with its input supplied from the further switching point.

The input balanced circuit described above may be modified by connecting the compensation circuit in a different manner. Thus instead of applying the output of the compensation circuit to that a.c. coupling connected to the switching point from which the input to the compensation circuit is taken, the output of the compensation circuit can be applied to the further a.c. coupling. In addition where a further compensation circuit is provided its output can be applied to the first-mentioned a.c. coupling.

In embodiments of the invention the switching devices used may be field-effect transistors.

BRIEF DESCRIPTION OF THE DRAWINGS

In order that the invention may be more fully understood reference will now be made to the accompanying drawings in which.

DETAILED DESCRIPTION OF THE PREFERRED EMBODIMENTS

Figure 1:
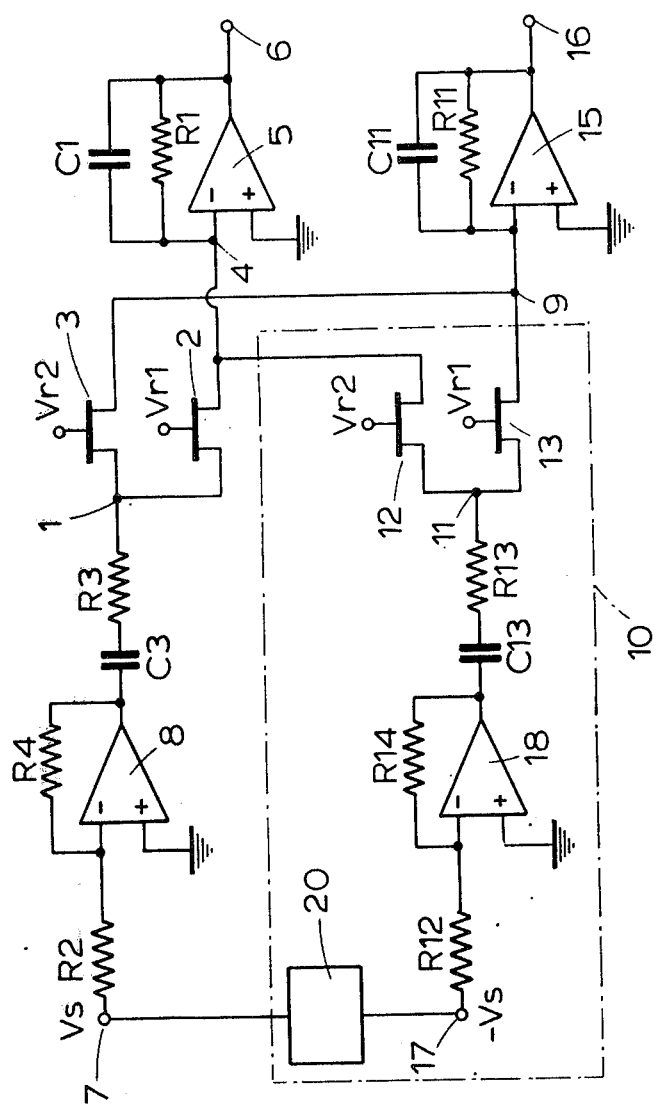
FIG. 1 is a circuit diagram of a phase-sensitive detector of the kind to which the present invention is applicable.

Referring now to FIG. 1 there is shown therein a phase-sensitive detector circuit in which there are joined at a switching point 1 two switching devices in the form of field-effect transistors 2 and 3. Reference signals Vr1 and Vr2 respectively are applied to the gates of the field-effect transistors 2 and 3. The reference signals Vr1 and Vr2 are in antiphase and any signal fed to switching point 1 will thus be switched between transistors 2 and 3 in the manner of a two way switch. Transistor 2 is connected to a point 4 which in turn is connected to the inverting input of an output operational amplifier 5. A feedback resistor R1 is connected between the output terminal 6 of operational amplifier 5 and point 4 and a feedback capacitor C1 is connected in parallel with resistor R1. The non-inverting input of operational amplifier 5 is earthed. Transistor 3 is connected to a point 9.

A signal Vs to be detected is applied at an input terminal 7 and is fed through an input resistor R2 to the inverting input of an input operational amplifier 8. The ouput of operational amplifier 8 is connected to switching point 1 through an a.c. coupling comprising a capacitor C3 and resistor R3. Operational amplifier 8 has a feedback resistor R4.

The circuit described so far, and assuming that point 9 is connected to earth, operates as a phase-sensitive detector for the input signal Vs. The effect of the feedback resistor R1 in the output operational amplifier 5 is to ensure that in the absence of any offset voltage in operational amplifier 5 point 4 is a virtual earth. Since point 9 is earthed and point 4 is a virtual earth it will be seen that switching point 1 is effectively at earth potential at all times during the reference switching cycle. Should a balanced output be required then point 9 instead of being earthed can be connected to the inverting input of a further output operational amplifier 15 the output terminal 16 of which is connected to its inverting input terminal through a feedback resistor R11 in parallel with a feedback capacitor C11. The circuit with a balanced output behaves in like manner to a circuit with an unbalanced output and the detected output of the circuit is obtained differentially between terminals 6 and 16.

By providing further components contained within the dotted line 10 the circuit can be input balanced. The further components comprise two field-effect transistors 12 and 13 connected at a switching point 11 and supplied with the reference switching signals Vr1 and Vr2. Transistor 13 is connected to point 9 and transistor 12 is connected to point 4. A further input terminal 17 is connected through a resistor R12 to a further input operational amplifier 18 the output of which is connected through an a.c. coupling comprising capacitor C13 and resistor R13 to the switching point 11. Input operational amplifier 18 has a feedback resistor R14 connected to its inverting input. For operation as an input balanced phase-sensitive detector the signal at point 11 is required to be in antiphase with the signal at point 1 and this may be achieved by connecting a phase inverter 20 between terminals 7 and 17 to produce an input signal —Vs at terminal 17. With an input balanced circuit output operational amplifier 15 can be dispensed within which case point 9 is earthed.

In practice offset voltages occur in operational amplifiers so that point 4 is held at a voltage which is not virtually earth potential but is offset therefrom by an amount depending on imperfections in operational amplifier 5. In like manner if an operational amplifier 15 is provided an offset voltage will also appear at point 9.

Figure 2:
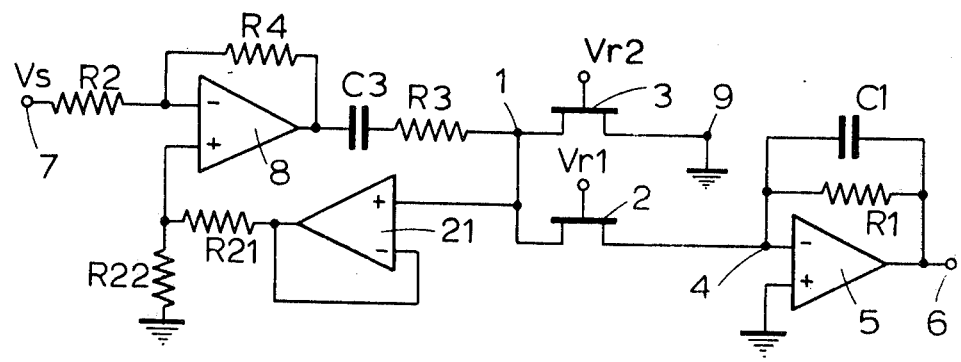
FIG. 2 is a circuit diagram of a phase-sensitive detector embodying the invention which has an unbalanced input and an unbalanced output.

The effect of any offset voltage occurring in the output operational amplifier can be compensated for in the phase-sensitive detector circuit shown in FIG. 2 which illustrates an embodiment of the invention. The circuit shown in FIG. 2 has an unbalanced input and an unbalanced output and like parts have like reference numerals to FIG. 1 but point 9 is earthed.

Any offset voltage at terminal 4 which is due to such voltage occurring in output operational amplifier 5 will be switched through transistor 2 and hence will appear at switching point 1 in alternate half-cycles of the reference switching signals while in intervening half-cycles of the reference signals point 1 will be earthed through transistor 3. Thus a square-wave voltage appears at point 1 which has a peak-to-peak amplitude equal in magnitude to the d.c. offset voltage at terminal 4. To cancel the effect of the offset voltage a compensation circuit is provided which comprises an operational amplifier 21 connected as a voltage follower, the non-inverting input to which is taken from switching point 1 and the output from which is taken through a resistor R21 to the non-inverting input of input operational amplifier 8. A resistor R22 is connected between the non-inverting input of operational amplifier 8 and earth. Thus the square-wave voltage appearing at point 1 due to the offset voltage is fed back through voltage follower 21 and is applied to the non-inverting input of amplifier 8. Since the signal input Vs is applied to the inverting input of amplifier 8 it will be seen that the output signal from amplifier 8 will represent the difference between the two inputs and hence the effect of the offset voltage in amplifier 5 can be cancelled when switching point 1 is connected to amplifier 5. By appropriately choosing the values of resistors R21 and R22 the effect of the compensating voltage that is fed back can be made to exactly balance the offset voltage of amplifier 5. It will be noted that while offset voltages may occur in both amplifiers 21 and 8 these will not affect the output from the circuit since any such offset voltages will be dc voltages and hence will be blocked by the ac coupling of capacitor C3.

Figure 3:
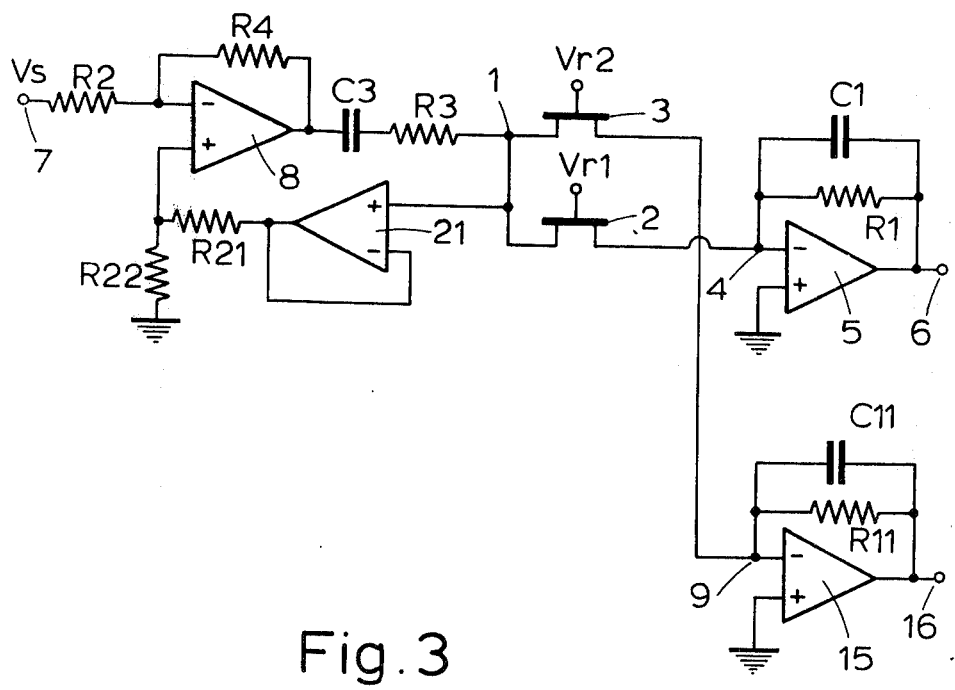
FIG. 3 is a circuit diagram similar to FIG. 1 but output balanced.

The circuit shown in FIG. 2 can be used where a balanced output is required and such a circuit is shown in FIG. 3 in which like parts have like reference numerals to FIGS. 1 and 2. In FIG. 3 both output operational amplifiers 5 and 15 may have offset voltages occurring in them. If these offset voltages happen to be equal then there will be no resultant square-wave voltage at switching point 1 but only a dc offset and the compensation circuit will provide no ac signal. Hence no compensation will be provided. Despite this the output of the circuit will not be affected since it is taken differentially from between terminals 6 and 16 and the voltages at both these terminals will be equally affected thus cancelling out the effect of the equal offset voltages. In general however the offset voltages occurring in amplifier 5 and 15 will be different and thus a square-wave voltage of magnitude proportional to their difference will occur at point 1. This square-wave voltage is fed back by the compensation circuit to the non-inverting input to amplifier 8 and hence the resultant signal from amplifier 8 includes a compensation component in like manner to the circuit of FIG. 2. This resultant signal is switched to each output operational amplifier in successive half-cycles to cancel any difference in offset voltages that may occur between them.

Figure 4:
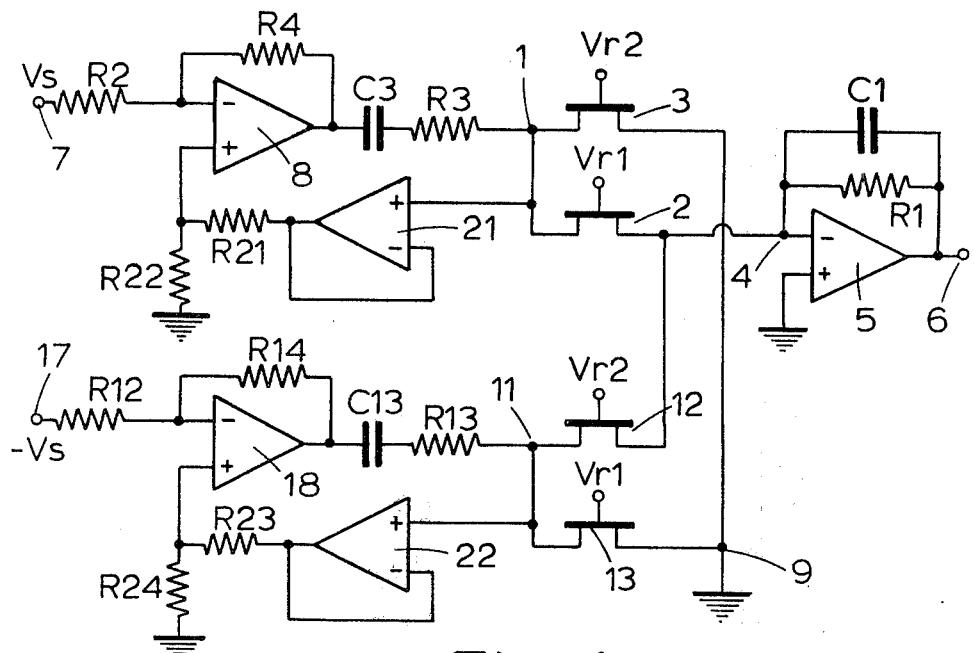
FIG. 4 is a circuit diagram of a phase-sensitive detector embodying the invention having a balanced input.

The circuit of FIG. 2 can be extended to be input balanced and such a circuit is shown in FIG. 4 in which again like parts have like reference numerals to the circuits of FIG. 1 and FIG. 2. In FIG. 4 the effect of any offset voltage occurring in output operational amplifier 5 appear as square-wave voltages at both switching points 1 and 11 and these square-wave voltages are in antiphase. The square-wave voltage at switching point 1 is fed back through the compensation circuit including operational amplifier 21 as described with reference to FIG. 2. The resultant signal from amplifier 8 is switched to amplifier 5 in alternate half-cycles of the reference signal. In like manner the square-wave voltage occurring at switching point 11 is fed back through a further compensation circuit comprising operational amplifier 22 which is connected through resistor R23 to the non-inverting input of operational amplifier 18. Amplifier 18 has an input resistor R24 connected to ground. The further compensation circuit operates in like manner to the first-mentioned compensation circuit, and the resultant signal from amplifier 18 is switched to amplifier 5 in the intervening half-cycles of the reference signal.

Figure 5:
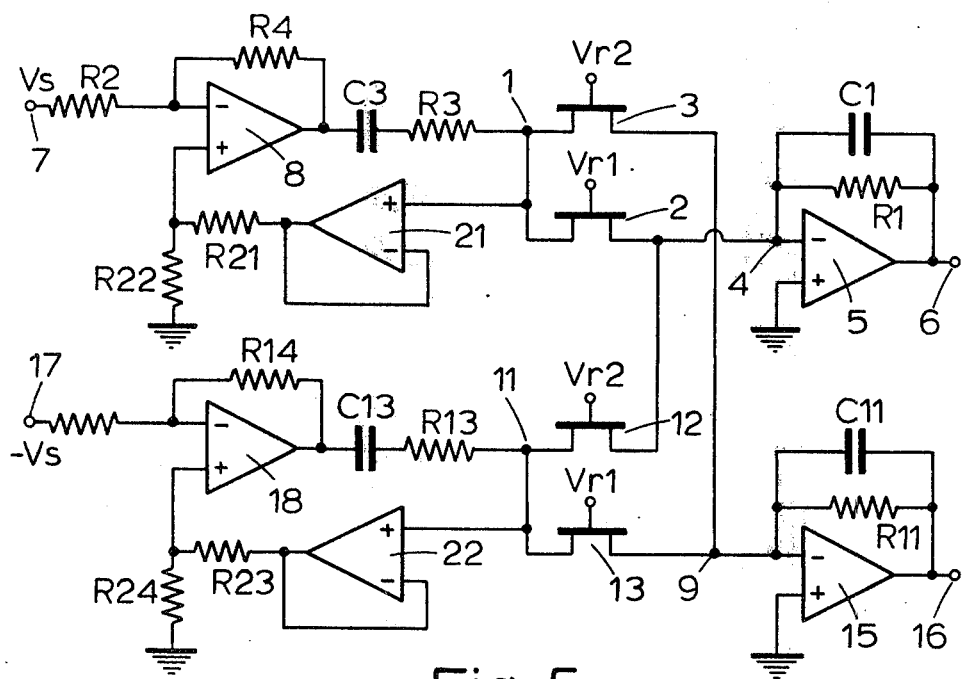
FIG. 5 is a circuit diagram of a circuit similar to FIG. 4 but output balanced.

The circuit of FIG. 4 can be modified to provide a balanced output and such a circuit is shown in FIG. 5 in which like parts have like reference numerals to FIGS. 3 and 4. In FIG. 5 point 9 is connected to a further output operational amplifier 15 instead of being earthed. As in the case of the FIG. 3 circuit square-wave voltages proportional to the difference between the offset voltages in amplifiers 5 and 15 appear at both points 1 and 11 and both these voltages are fed back through the respective compensation circuits which include the voltage follower operational amplifiers 21 and 22, derive resultant signals which are coupled to switching points 1 and 11 for distribution to the output operational amplifiers 5 and 15.

Figure 6:
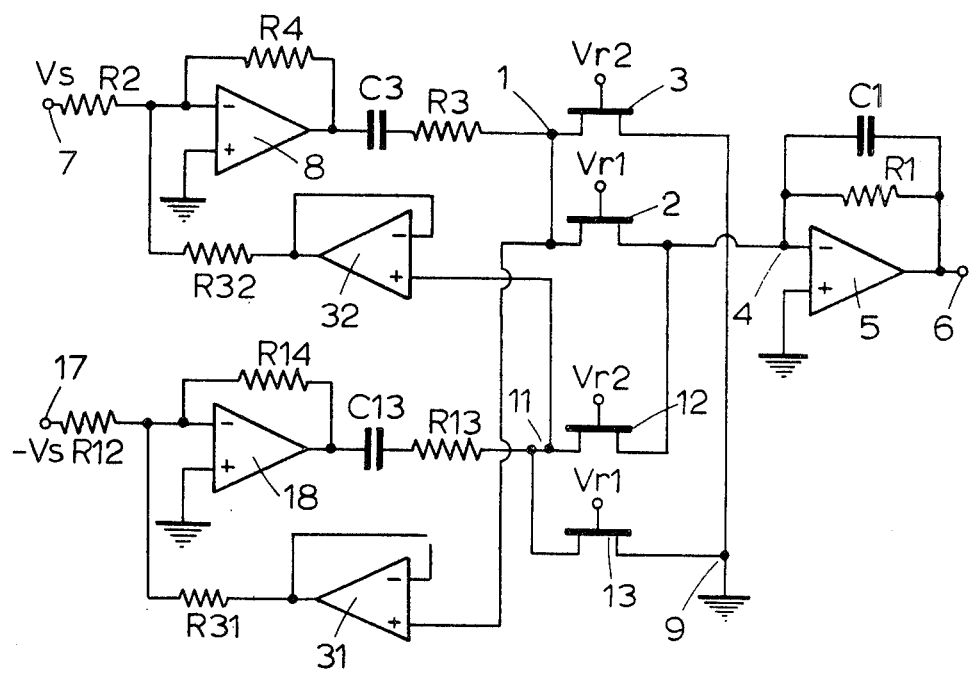
FIG. 6 is a modified version of the circuit of FIG. 4.

In the case of the input-balanced circuit shown in FIG. 4 all of the information regarding the offset voltage in output amplifier 5 is available at both switching points 1 and 11 and the square-wave voltages at these points have equal peak-to-peak amplitudes, representing the magnitude of the offset voltage in amplifier 5 but these square-wave voltages are in antiphase. Thus in the case of an input-balanced circuit it is not necessary for a compensation voltage to be fed back to the same point from which it is derived but instead it can be fed to the antiphase input terminal provided that the connections take into account the appropriate phase relationship. Such a circuit is illustrated in FIG. 6 which shows an input-balanced phase sensitive detector circuit similar to the circuit shown in FIG. 4 but with the connections of the compensation circuits modified. In FIG. 6 like parts have like reference numerals to FIG. 4 but the compensation circuit connected to switching point 1 comprises an operational amplifier 31 connected as a voltage follower the output of which is connected through a resistor R31 to the inverting input of amplifier 18. In like manner a further compensation circuit is provided comprising an operational amplifier 32 connected as a voltage follower the non-inverting input to which is connected to switching point 11 and the output from which is connected through a resistor R32 to the inverting input of amplifier 8.

In the above circuit it will thus be seen that the compensation voltages are added to the respective input signals Vs and −Vs but these compensation voltages are in antiphase to the square-wave offset voltages appearing at the switching points so that they subtract from these voltages.

Figure 7:
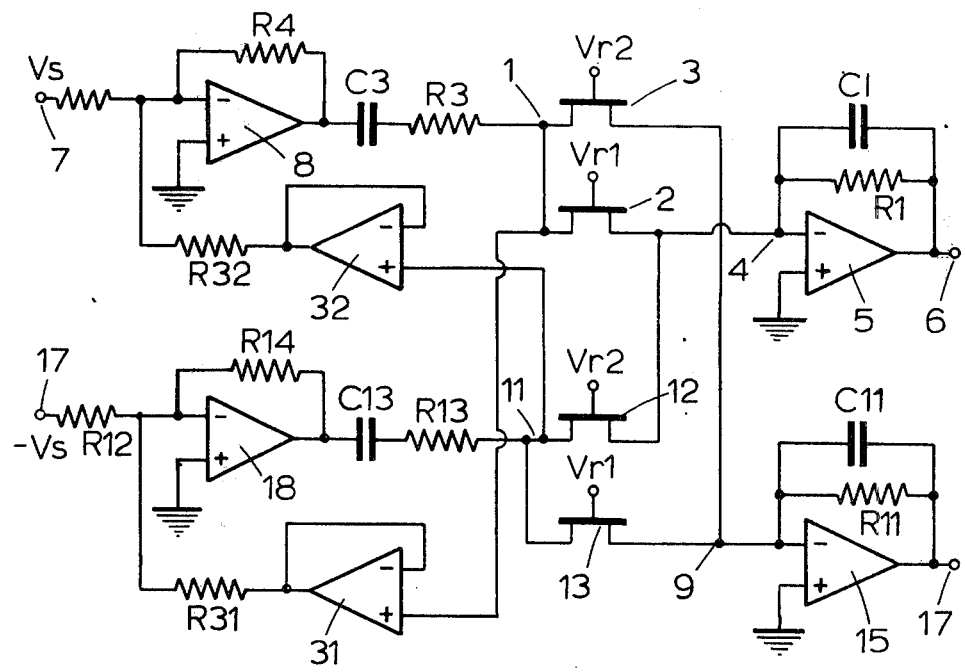
FIG. 7 is a circuit diagram similar to FIG. 6 but output balanced.

The circuit of FIG. 6 can be readily adapted to a balanced output circuit and such a circuit is shown in FIG. 7 in which like parts have like reference numerals to FIG. 6 except that point 9 instead of being earthed is connected to the inverting input of output operational amplifier 15. For the circuit of FIG. 7 square-wave voltages of peak-to-peak amplitudes representing any difference between the offset voltages occurring in amplifiers 5 and 15 but in antiphase appear at both points 1 and 11 in like manner to the circuit of FIG. 5 and these offset voltages are compensated for by compensation circuits connected in like manner to FIG. 6.

In the case of circuits such as those shown in FIG. 5 and FIG. 7 which have both balanced inputs and balanced outputs it will be seen that the square-wave voltage representing any difference in offset voltage in the output operational amplifiers 5 and 15 is present at both point 1 and point 11. It is therefore not necessary to provide two compensation circuits but the circuits of FIG. 5 and FIG. 7 can function equally well if only one compensation circuit is provided. Thus in FIG. 5 compensation circuit 22 may be dispensed with and in FIG. 7 compensation circuit 32 may be dispensed with. However for the remaining circuit to function properly the output voltage from the single compensation circuit that is used needs to be double in amplitude to that required when two compensation circuits are provided.

I claim:

1. A phase-sensitive detector circuit characterised in that it comprises in combination a pair of switching devices joined at a switching point and arranged for control by reference switching signals in antiphase, an a.c. coupling between a signal input terminal and the said switching point, an output operational amplifier including a feedback path from the output thereof to an input thereof whereby to hold said input virtually at ground potential in the absence of any offset voltage in said operational amplifier, a connection from one of the switching devices to an input of the output operational amplifier, a connection from the other of the switching devices to a terminal which is at ground potential, and a compensation circuit the input to which is supplied from the said switching point and the output from which is applied to the input side of said a.c. coupling for the purpose of providing a compensating signal to tend to eliminate the effect of any offset voltage occurring in the output operational amplifier.

2. The phase-sensitive detector circuit as claimed in claim 1, in which the compensation circuit includes an operational amplifier as a voltage follower.

3. The phase-sensitive detector circuit as claimed in claim 2, in which an input operational amplifier is provided and the signal input terminal is connected to the inverting input of the input operational amplifier, the said switching point is connected to the non-inverting input of the operational amplifier included in the compensation circuit and the output of the compensation circuit is connected to the non-inverting input of the input operational amplifier.

4. The phase-sensitive detector circuit as claimed in claim 1, and modified in that a further output operational amplifier is provided and a connection is made from the other of said switching devices to an input of said further output operational amplifier, instead of to said terminal at ground potential.

5. The phase-sensitive detector circuit as claimed in claim 4 in which a feedback path is provided from the output of the further output operational amplifier to the said input thereof whereby to hold the said input virtually at ground potential.

6. A phase-sensitive detector circuit characterized in that is comprises in combination a first pair of switching devices joined at a first switching point, a further pair of switching devices joined at a further switching point, said first pair of switching devices and said further pair of switching devices both being arranged for control by reference switching signals in antiphase, a first AC coupling between a signal input terminal and said first switching point, a further AC coupling taken between said signal input terminal and said further switching point, means for enabling signals in antiphase to be applied from said signal input terminal to said first AC coupling and said further AC coupling, an output operational amplifier including a feedback path from the output thereof to an input thereof whereby to hold said input virtually at ground potential in the absence of any offset voltage in said operational amplifier, a connection from one of the switching devices connected to the first switching point to an input of the output operational amplifier, a connection from one of the switching devices connected to the further switching point to the said input of the output operational amplifier, connections from the other of the switching devices of each pair to a terminal which is at ground potential, and a compensation circuit the input of which is supplied from said first switching point and the output from which is applied to the input side of the first AC coupling for the purpose of providing a compensation signal to tend to eliminate the effect of any offset voltage occuring in the output operational amplifier.

7. The phase-sensitive detector circuit as claimed in claim 6 in which a further input operational amplifier is provided between the signal input terminal and the said further a.c. coupling.

8. The phase-sensitive detector circuit as claimed in claim 6, and modified in that the compensation circuit has its input supplied from the said further switching point instead of from the first-mentioned switching point.

9. The phase-sensitive detector circuit as claimed in claim 6, in which a further compensating circuit is provided, the input to which is supplied from the said further switching point and the output from which is supplied to the said further a.c. coupling to assist in providing a compensating signal to eliminate the effect of any offset voltage in the output operational amplifier.

10. The phase-sensitive detector circuit as claimed in claim 9 in which the said further compensating circuit includes an operational amplifier connected as a voltage follower.

11. The phase-sensitive detector circuit as claimed in claim 9 and modified in that the said further compensating circuit has its input supplied from the first-mentioned switching point instead of from the said further switching point.

12. The phase-sensitive detector circuit as claimed in claim 1 in which the switching devices comprise field-effect transistors.

* * * * *